(12) United States Patent
Lu et al.

(10) Patent No.: US 12,426,147 B2
(45) Date of Patent: Sep. 23, 2025

(54) ELECTRONIC DEVICE

(71) Applicant: AUO Corporation, Hsinchu (TW)

(72) Inventors: Chih-Wen Lu, Hsinchu (TW); Fan-Yu Chen, Hsinchu (TW); Chun-Yueh Hou, Hsinchu (TW); Hsi-Hung Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 182 days.

(21) Appl. No.: 18/480,523

(22) Filed: Oct. 4, 2023

(65) Prior Publication Data

US 2024/0147639 A1 May 2, 2024

(30) Foreign Application Priority Data

Oct. 31, 2022 (TW) .................................. 111141463

(51) Int. Cl.
*H05K 1/02* (2006.01)
*H05K 3/28* (2006.01)

(52) U.S. Cl.
CPC ............... *H05K 1/02* (2013.01); *H05K 3/285* (2013.01); *H05K 2201/02* (2013.01)

(58) Field of Classification Search
CPC ....... H05K 1/02; H05K 2201/02; H05K 3/285
See application file for complete search history.

(56) References Cited

U.S. PATENT DOCUMENTS

| | | | | |
|---|---|---|---|---|
| 6,025,901 | A * | 2/2000 | Adachi | G02F 1/13452 |
| | | | | 349/158 |
| 9,835,913 | B2 | 12/2017 | Pellerite et al. | |
| 10,101,617 | B2 | 10/2018 | Pellerite et al. | |
| 10,964,868 | B2 * | 3/2021 | Song | H10H 20/857 |
| 11,374,195 | B2 | 6/2022 | Yu | |
| 11,538,406 | B2 * | 12/2022 | Zhao | G09G 3/3233 |
| 2014/0085573 | A1 | 3/2014 | Pellerite et al. | |
| 2018/0067352 | A1 | 3/2018 | Pellerite et al. | |
| 2020/0303608 | A1 | 9/2020 | Song | |
| 2021/0167322 | A1 | 6/2021 | Yu | |
| 2022/0052241 | A1 | 2/2022 | Lu et al. | |
| 2024/0258325 | A1 * | 8/2024 | Liu | G09F 9/33 |

FOREIGN PATENT DOCUMENTS

| | | |
|---|---|---|
| CN | 103460123 | 12/2013 |
| CN | 110767843 | 2/2020 |
| CN | 111338143 | 6/2020 |

(Continued)

*Primary Examiner* — James Wu
(74) *Attorney, Agent, or Firm* — JCIPRNET

(57) ABSTRACT

An electronic device includes a substrate, a side wiring, a protective film, and a first filler. The substrate has a first surface, a second surface, and a side surface connected between the first surface and the second surface. The side wiring is disposed on the substrate and extends from the first surface to the second surface through the side surface. The protective film is disposed on the side wiring. The side wiring is sandwiched between the substrate and the protective film. An edge of the protective film extends beyond a side wall of the side wiring, and the protective film, the side wall of the side wiring, and the substrate define a gap. The first filler is disposed on the protective film and in the gap, wherein the first filler includes a first material and a plurality of particles mixed within the first material.

7 Claims, 11 Drawing Sheets

(56) References Cited

FOREIGN PATENT DOCUMENTS

| | | |
|---|---|---|
| CN | 113644085 | 11/2021 |
| TW | 200537243 | 11/2005 |
| TW | 200746179 | 12/2007 |
| TW | 202023085 | 6/2020 |
| TW | 202215389 | 4/2022 |

\* cited by examiner the viscosity of the first material of the first filler=53000cP the viscosity of the first material of the first filler=50000cP the viscosity of the first material of the first filler=12000cP

164B

164C

164sa
164s

164D

ELECTRONIC DEVICE

CROSS-REFERENCE TO RELATED APPLICATION

This application claims the priority benefit of Taiwan application serial no. 111141463, filed on Oct. 31, 2022. The entirety of the above-mentioned patent application is hereby incorporated by reference herein and made a part of this specification.

BACKGROUND

Technical Field

The disclosure relates to an electronic device.

Description of Related Art

With the advancement of technology, the screen-to-body ratio of a display panel has become an important factor for many consumers when purchasing a display device. To improve the screen-to-body ratio, a driver chip without a display function may be disposed on the back of the substrate of the display panel, and the side wiring disposed on the side surface of the substrate may be used to electrically connect the driver chip on the back and the pixels on the front. Generally speaking, a moisture blocking material is formed on the side wiring for protecting the side wiring. However, due to limitation brought by the structure of the display panel itself, the moisture blocking material may not completely cover the side wiring, resulting in poor reliability of the display panel.

SUMMARY

The disclosure provides an electronic device with good reliability.

The electronic device of the disclosure includes a substrate, a side wiring, a protective film, and a first filler. The substrate has a first surface, a second surface, and a side surface connected between the first surface and the second surface. The side wiring is disposed on the substrate and extends from the first surface to the second surface through the side surface. The protective film is disposed on the side wiring. The side wiring is sandwiched between the substrate and the protective film. An edge of the protective film extends beyond a side wall of the side wiring. The protective film, the side wall of the side wiring, and the substrate define a gap. The first filler is disposed on the protective film and in the gap. The first filler includes a first material and multiple particles mixed within the first material.

In an embodiment of the disclosure, the gap has a width a in a direction perpendicular to the side surface of the substrate. One of the particles is disposed in the gap. The one of the particles has a height b in the direction, and a≥b>0.5a.

In an embodiment of the disclosure, a viscosity of the first material of the first filler is less than or equal to 50000 cP.

In an embodiment of the disclosure, the electronic device further includes a second filler disposed on the first filler. A water vapor transmission rate of the second filler is lower than a water vapor transmission rate of the first filler.

In an embodiment of the disclosure, the electronic device further includes a second filler disposed on the first filler. A viscosity of the first filler is lower than a viscosity of the second filler.

In an embodiment of the disclosure, one of the particles is spherical, rod-shaped or irregular.

In an embodiment of the disclosure, one of the particles is a sphere, and a spherical surface of the sphere has multiple protrusions.

DESCRIPTION OF THE EMBODIMENTS

Figure 1A:
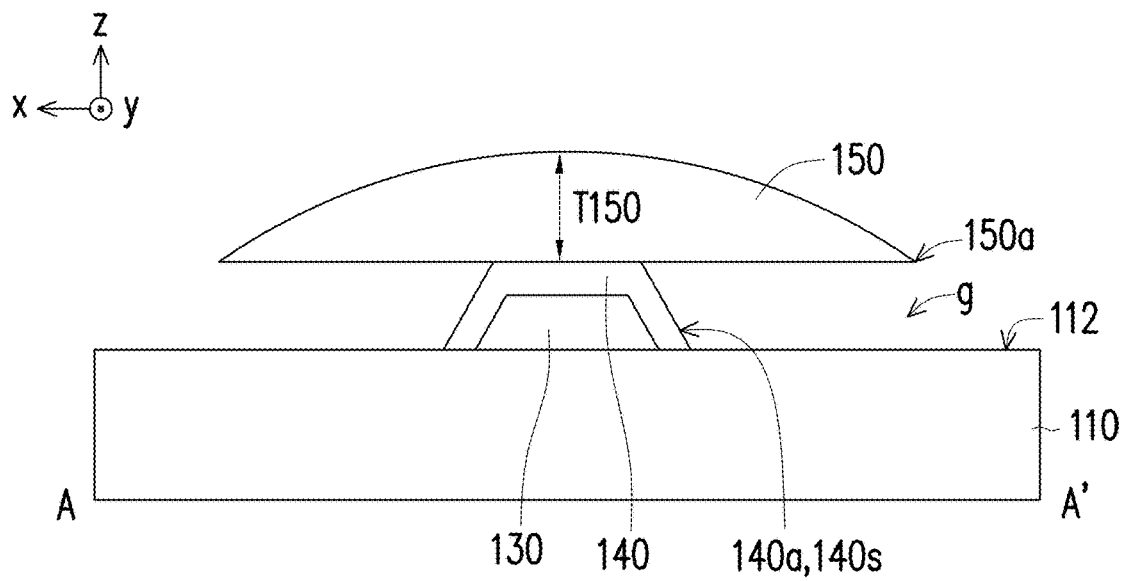
FIGS. 1A to 1E are schematic cross-sectional views of a manufacturing process of an electronic device according to an embodiment of the disclosure.
Figure 1B:
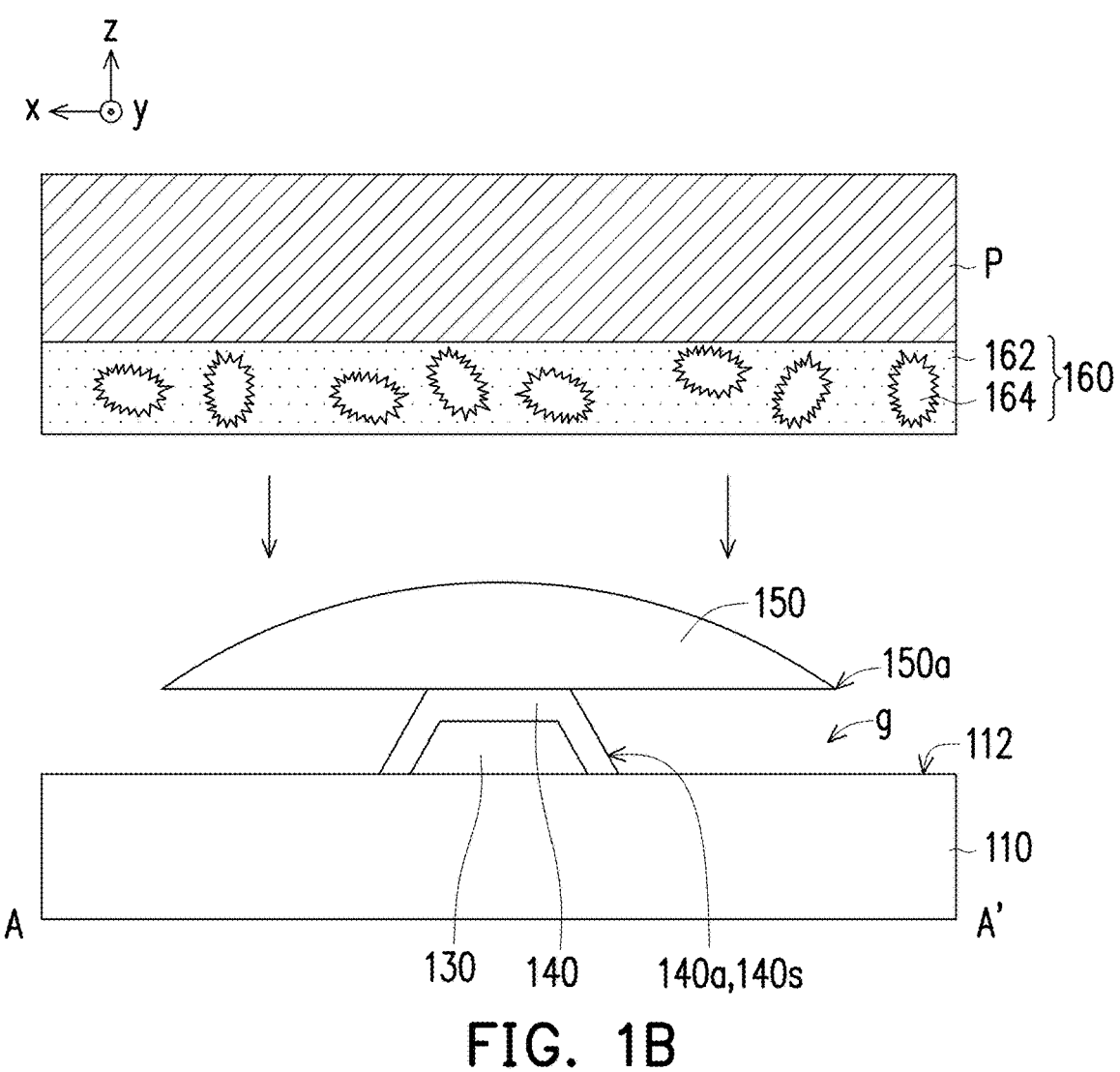

Reference will now be made in detail to the exemplary embodiments. Examples of exemplary embodiments are described in the accompanying drawings. Wherever possible, the same reference symbols are used to denote the same or similar parts in the drawings and the description.

It should be understood that when an element such as a layer, a film, an area, or a substrate is described as being "on" another element or "connected to" another element, the element may be directly on another element or connected to another element, or there may be other elements interposed therebetween. In contrast, when an element is described as being "directly on another element" or "directly connected to" another element, there is no other element therebetween. Herein, "connect" used in the specification may refer to physical and/or electrical connection. Furthermore, "electrically connect" or "coupled to" may mean that there are other elements interposed between two elements.

The usages of "approximately", "close to", or "substantially" throughout the specification include the indicated value and an average value within an acceptable deviation range of the specific value confirmed by those skilled in the art, considering the measurement in question and a specific number of errors related to the measurement (that is, the limitation of measurement system). For example, "approximately" may mean to be within one or more standard deviations of the value, or within ±30%, ±20%, ±10%, or ±5%. Furthermore, the usages of "approximately", "close to" or "substantially" throughout the specification allow selection of a more acceptable deviation scope or standard deviation depending on optical properties, etching properties, or other properties, and it is not necessary to use one standard deviation for all properties.

Unless otherwise defined, the terms used throughout the specification (including both technical and scientific terms) have the same meanings as understood by those skilled in the art. It should be further understood that, terms such as those defined in commonly used dictionaries should be interpreted as having meanings consistent with the meanings in the related art and the context of the invention, and shall not be interpreted as having idealized or overly formal meanings, unless definitely defined in the content.

FIGS. 1A to 1E are schematic cross-sectional views of a manufacturing process of an electronic device according to an embodiment of the disclosure. FIG. 2 is a perspective schematic view of an electronic device according to an embodiment of the disclosure. FIGS. 1A to 1E correspond to line A-A' of FIG. 2. FIG. 3 is a schematic cross-sectional view of an electronic device according to an embodiment of the disclosure. FIG. 3 corresponds to line B-B' of FIG. 2. For clarity, a direction x, a direction y, and a direction z that intersect each other are illustrated in the figures.

Figure 2:
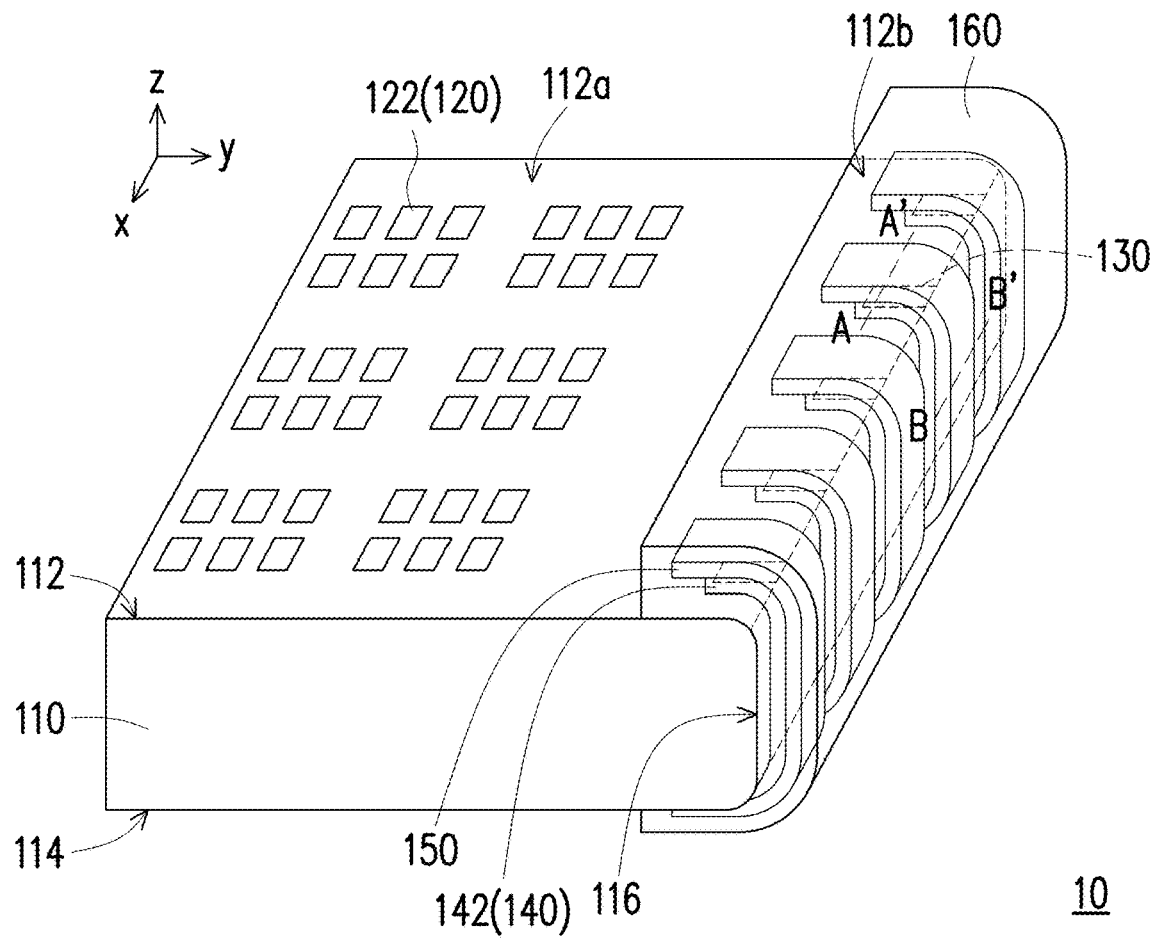
FIG. 2 is a perspective schematic view of an electronic device according to an embodiment of the disclosure.
Figure 3:
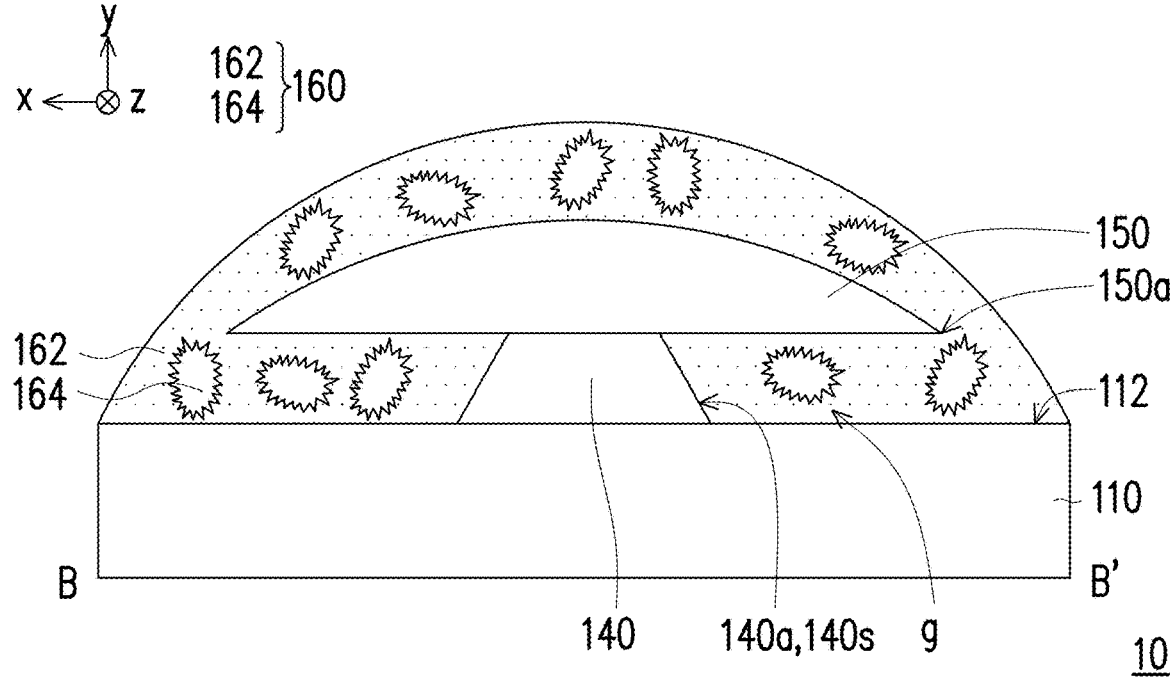
FIG. 3 is a schematic cross-sectional view of an electronic device according to an embodiment of the disclosure.

Referring to FIG. 1A and FIG. 2, firstly, a substrate 110, a pixel driving circuit structure 120, an edge pad 130, a side wiring 140, and a protective film 150 are provided.

The substrate 110 has a first surface 112, a second surface 114 and a side surface 116 connected between the first surface 112 and the second surface 114. A normal direction of the first surface 112 (for example: the direction z), a normal direction of the second surface 114 (for example: the opposite direction of the direction z) and a normal direction of the side surface 116 (for example: the direction y) are different from each other. The first surface 112 has an active area 112a and an edge area 112b outside the active area 112a. The pixel driving circuit structure 120 is disposed on the active area 112a of the first surface 112. The edge pad 130 is disposed on the edge area 112b of the first surface 112 and is electrically connected to the pixel driving circuit structure 120.

In this embodiment, the pixel driving circuit structure 120 may include a pixel pad 122 and a pixel driving circuit (not shown) electrically connected to the pixel pad 122, and the edge pad 130 is electrically connected to the pixel driving circuit. For example, in this embodiment, the pixel driving circuit may include a signal line, an active element, a passive element, etc. The active element is, for example, a transistor, and the passive element is, for example, a capacitor structure. The edge pad 130 may be electrically connected to the signal line. However, the disclosure is not limited thereto. In this embodiment, the pixel pad 122 may be used to connect with a light emitting element (not shown), such as a micro light emitting diode (LED), but the disclosure is not limited thereto.

The side wiring 140 is disposed on the substrate 110 and extends from the first surface 112 to the second surface 114 through the side surface 116. For example, in this embodiment, one end 142 of the side wiring 140 covers on the edge pad 130 and is electrically connected to the edge pad 130, while another end (not shown) of the side wiring 140 is disposed on the second surface 114 of the substrate 110 and is electrically connected to an electronic element (such as but not limited to: a fan-out trace, a driving chip, etc.) disposed on the second surface 114.

The protective film 150 is disposed on the side wiring 140. The side wiring 140 is sandwiched between the substrate 110 and the protective film 150. An edge 140a of the side wiring 140 may be retracted relatively to an edge 150a of the protective film 150 to form an undercut structure. That is to say, the edge 150a of the protective film 150 extends beyond a side wall 140s of the side wiring 140, and a gap g is defined by the protective film 150, the side wall 140s of the side wiring 140 and the substrate 110. In addition, in this embodiment, a thickness T150 of the protective film 150 may be non-uniform. For example, in this embodiment, the thickness T150 of the protective film 150 may become thinner toward the edge 150a.

Referring to FIG. 1B to FIG. 1E, next, a first filler 160 is formed on the protective film 150 and in the gap g. For example, in this embodiment, the first filler 160 may be formed on the protective film 150 and in the gap g by printing. Specifically, the first filler 160 may be coated or applied on a printing tool P first, and then the printing tool P is pressed against the side surface 116 of the substrate 110, so that the first filler 160 on the printing tool P is attached to the protective surface 150 and penetrates into the gap g by a capillary phenomenon. Next, after the printing tool P is removed, the first filler 160 is cured. At this stage, an electronic device 10 is completed.

Figure 1C:
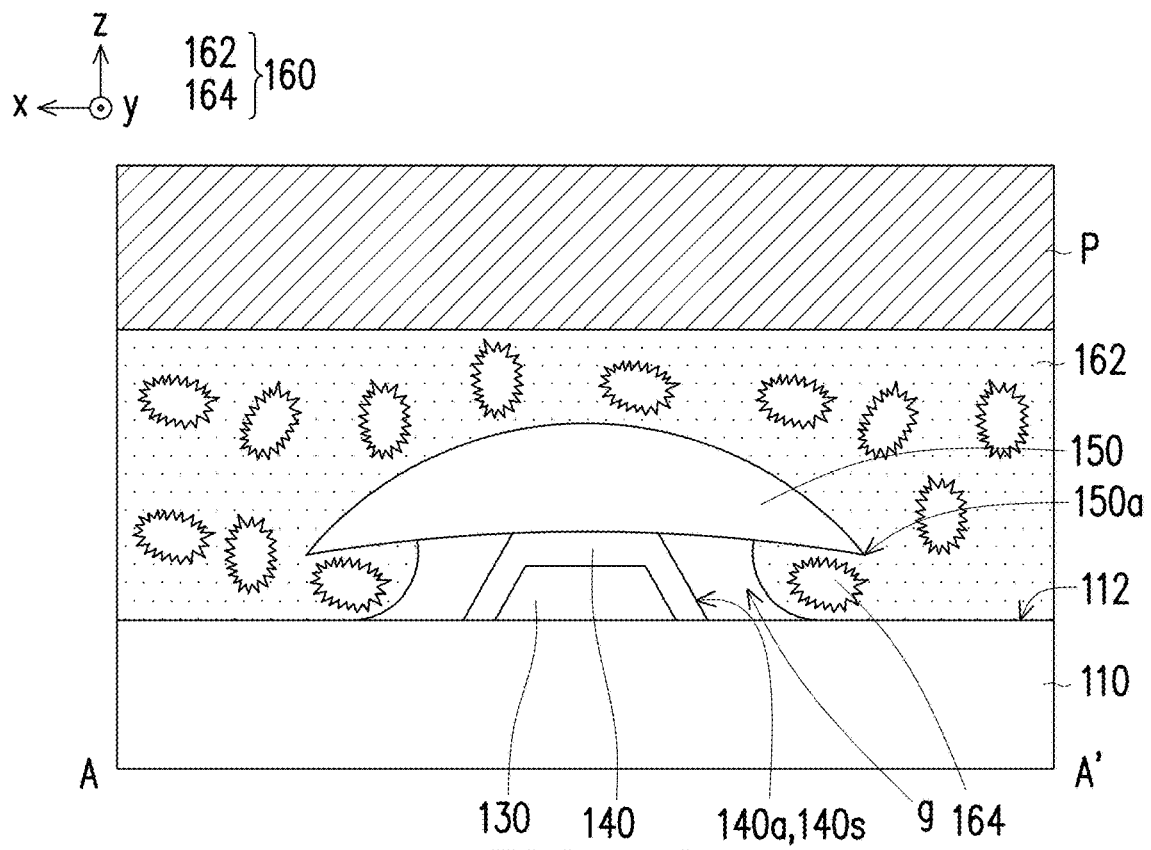
Figure 1D:
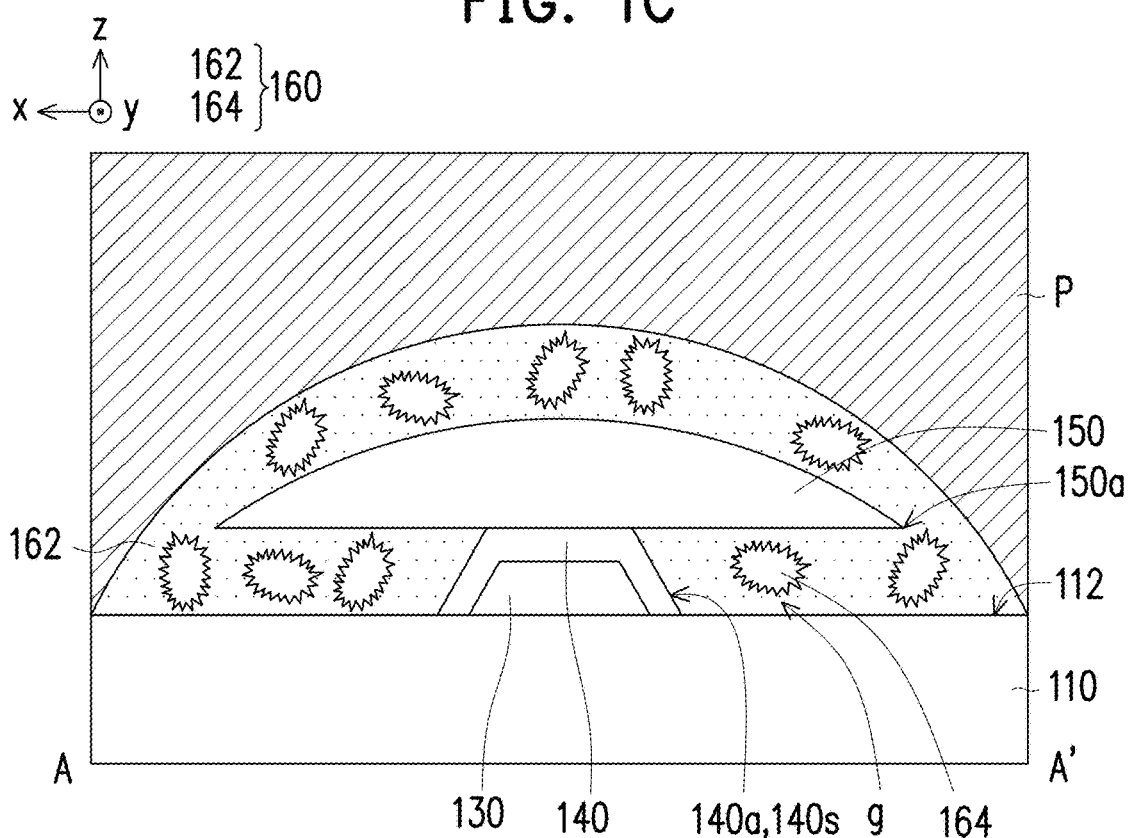

Referring to FIG. 1C and FIG. 1D, it is worth noting that the first filler 160 includes a first material 162 and multiple particles 164 mixed within the first material 162. During the process of using the printing tool P to press the substrate 110 so that the first filler 160 on which is attached to the protective film 150 and penetrates into the gap g by the capillary phenomenon, part of the particles 164 follow the flowable first filler 162 and penetrate into the gap g. When the printing tool P presses against the substrate 110 so that both sides of the protective film 150 are bent and deformed, the part of the particles 164 penetrating into the gap g may play a role of supporting the protective film 150, so that there is still the gap g between the protective film 150 and the substrate 110. The first filler 160 may continue to penetrate toward the side wall 140s of the side wiring 140 by the capillary phenomenon, and then contact the side wall 140s of the side wiring 140 and completely fill the gap g. In short, adding the particles 164 to the first material 162 may enable the first filler 160 to smoothly fill the gap g between the protective film 150, the side wall 140s of the side wiring 140 and the substrate 110, thereby increasing the reliability of the electronic device 10. In this embodiment, the particle 164 may optionally be irregular. However, the disclosure does not limit the shape of the particle 164, and in other embodiments, the particle 164 may also be in other shapes.

Figure 4:
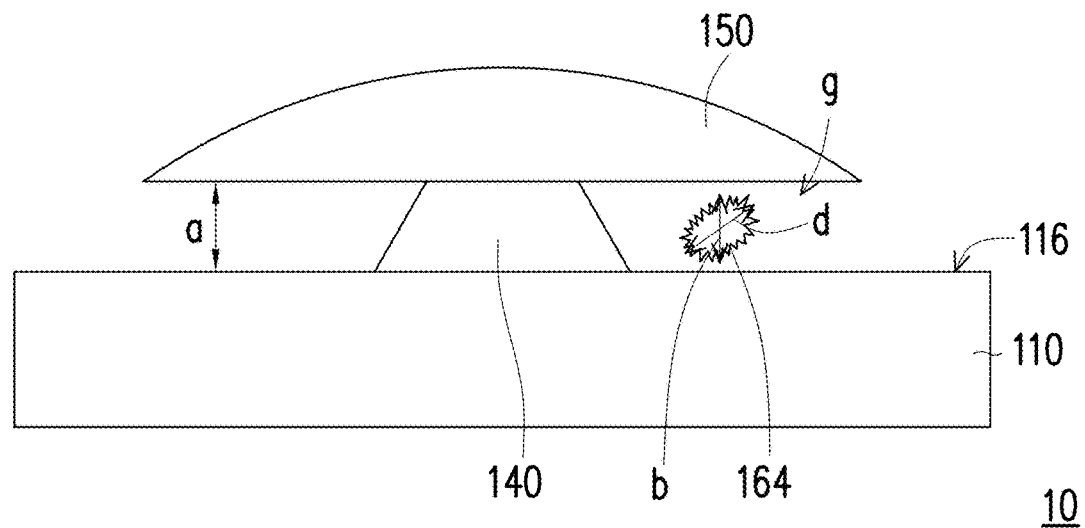
FIG. 4 shows a particle in a gap of an electronic device according to an embodiment of the disclosure.
Figure 5:
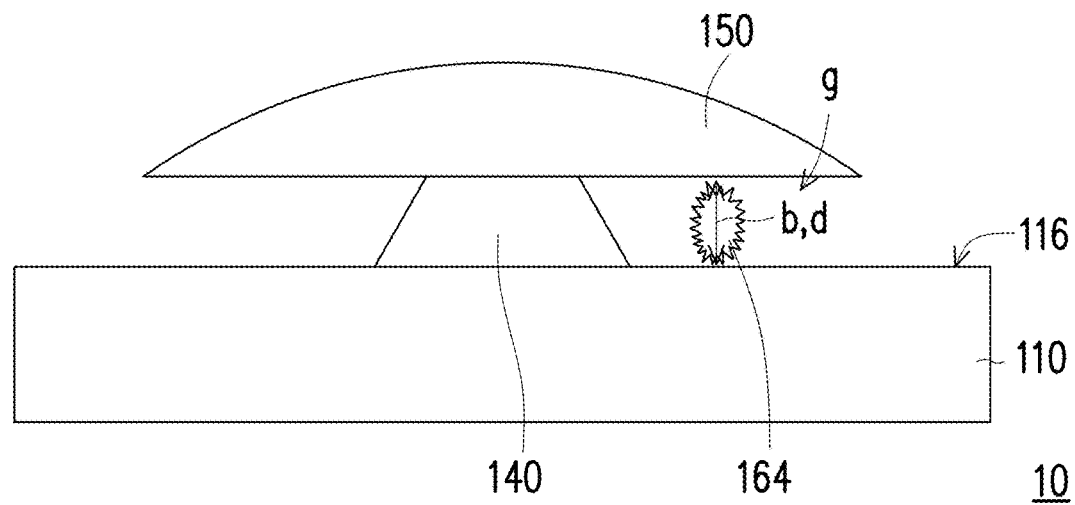
FIG. 5 shows another particle in a gap of an electronic device according to an embodiment of the disclosure.

FIG. 4 shows a particle in a gap of an electronic device according to an embodiment of the disclosure. FIG. 5 shows another particle in a gap of an electronic device according to an embodiment of the disclosure. Referring to FIG. 4 and FIG. 5, the particle 164 is disposed on the gap g. The particle 164 has a height b in the direction y. The particle 164 has a maximum size d. The height b of the particle 164 in the direction y may be smaller than d (as shown in FIG. 4) or equal to d (as shown in FIG. 5). In this embodiment, the gap g has a width a in the direction y perpendicular to the side surface 116 of the substrate 110. The particle 164 is disposed on the gap g. The particle 164 has the height b in the direction y, and a≥b>0.5a. Thereby, the particle 164 may smoothly enter the gap g and play a role of supporting the protective film 150 during the process corresponding to FIG. 1C, so that the first filler 160 completely fills the gap g, which is confirmed below with reference to FIG. 6, FIG. 7 and FIG. 8.

Figure 6:
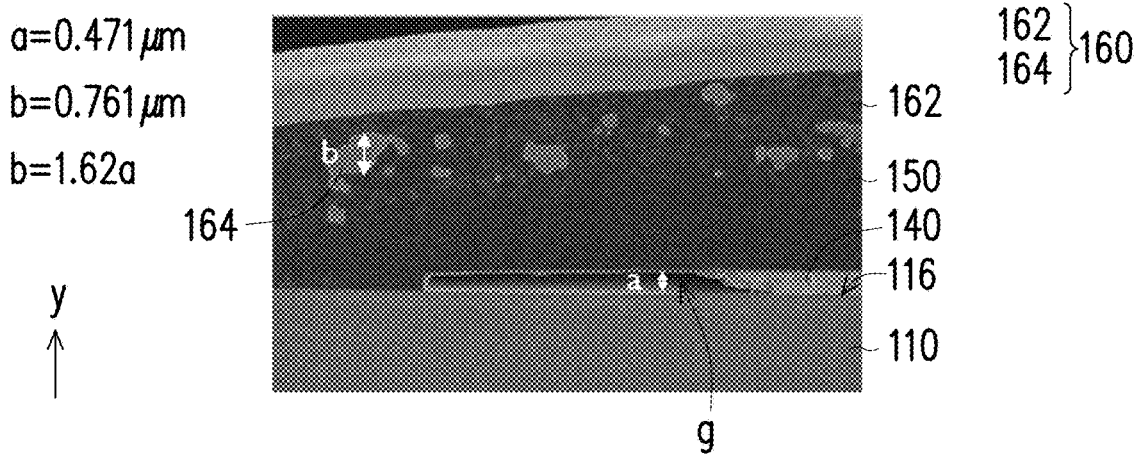
FIG. 6 shows cross-sections of a substrate, a side wiring, a protective film and a first filler captured with an electron microscope.

FIG. 6 shows the cross-sections of the substrate 110, the side wiring 140, the protective film 150 and the first filler 160 captured with an electron microscope. The width of the particle 164 of the first filler 160 in FIG. 6 in the direction y perpendicular to the side surface 116 of the substrate 110 is a=0.471 μm, and the height of the gap g in the direction y is b=0.761 μm, namely b=1.62a. It may be seen from FIG. 6 that when b=1.62a (i.e. when b>a), the particle 164 does not enter the gap g, and the first filler 160 does not completely fill the gap g.

Figure 7:
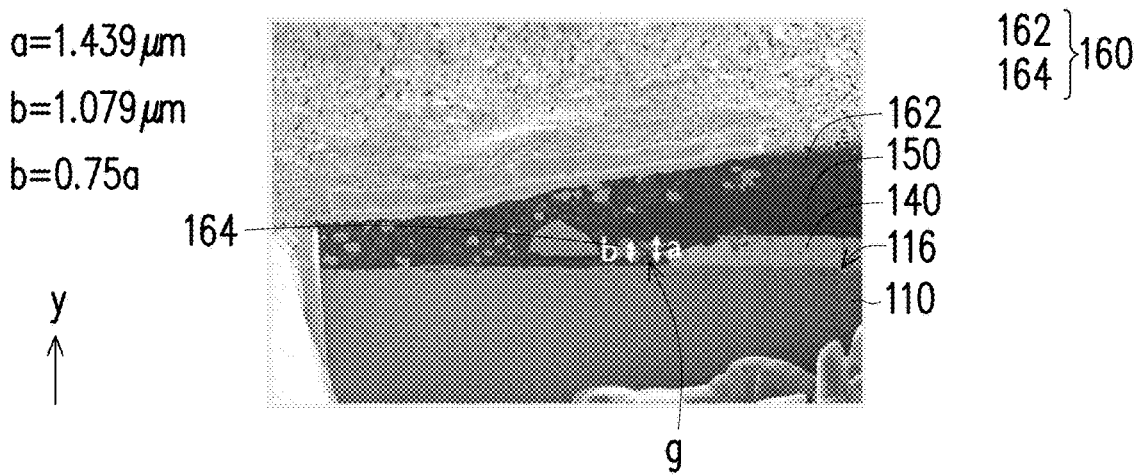
FIG. 7 shows cross-sections of a substrate, a side wiring, a protective film and a first filler captured with an electron microscope.

FIG. 7 shows the cross-sections of the substrate 110, the side wiring 140, the protective film 150 and the first filler 160 captured with an electron microscope. The width of the particle 164 of the first filler 160 in FIG. 7 in the direction y perpendicular to the side surface 116 of the substrate 110 is a=1.439 μm, and the height of the gap g in the direction y is b=1.079 μm, namely b=0.75a. It may be seen from FIG. 7 that when b=0.75a (i.e. when a≥b>0.5a), the particle 164 may enter the gap g to play a role of supporting the protective film 150, so that the first filler 160 completely fills the gap g.

Figure 8:
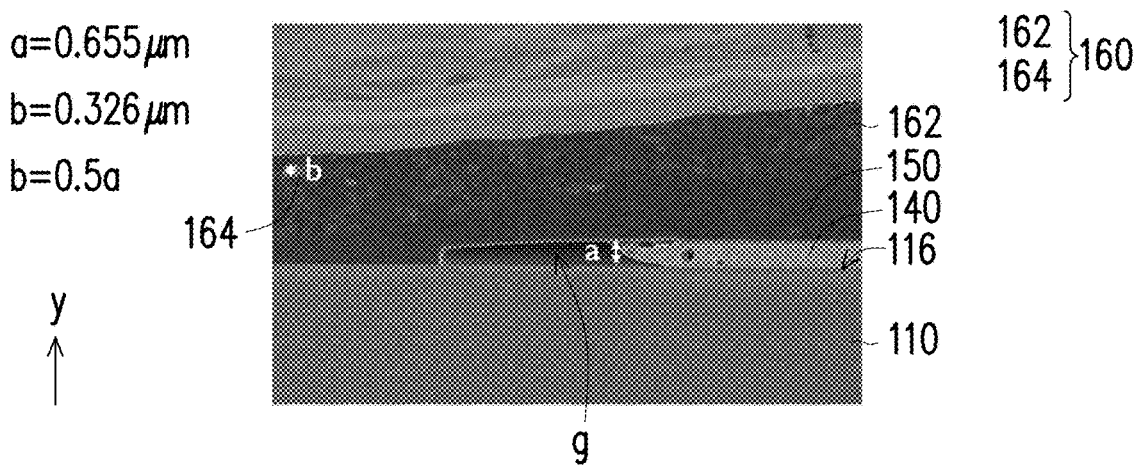
FIG. 8 shows cross-sections of a substrate, a side wiring, a protective film and a first filler captured with an electron microscope.

FIG. 8 shows the cross-sections of the substrate 110, the side wiring 140, the protective film 150 and the first filler 160 captured with an electron microscope. The width of the particle 164 of the first filler 160 in FIG. 8 in the direction y perpendicular to the side surface 116 of the substrate 110 is a=0.655 μm, and the height of the gap g in the direction y is b=0.326 μm, namely b=0.50a. It may be seen from FIG. 8 that when b=0.5a, the particle 164 may not support the protective film 150 well and maintain the sufficient gap g when the printing tool P (drawn in FIG. 1C) presses against the substrate 110. The first filler 160 does not completely fill the gap g.

Referring to FIG. 1C, the particle 164 of the first filler 160 are supportive and compressible. In this embodiment, the material of the particle 164 may be organic materials, inorganic materials, other materials or combinations thereof. For example, the material of the particle 164 may be silicon oxide, epoxy resins, carbon black or polyester fibers, but the disclosure is not limited thereto. For example, the material of the first material 162 may be polyester resins, phenolic resins, alkyd resins, polycarbonate resins, polyamide resins, polyurethane resins, silicone resins, epoxy resins, polyethylene resins, acrylic resins, polystyrene resins, polypropylene resins or any other protective and waterproof materials, but the disclosure is not limited thereto. In this embodiment, the first material 162 of the first filler 160 preferably has a low viscosity so that the first filler 160 may penetrate into the gap g by the capillary phenomenon. For example, the viscosity of the first material 162 of the first filler 160 is preferably less than or equal to 50000 cP, which is confirmed below with reference to FIG. 9, FIG. 10, and FIG. 11.

Figure 9:
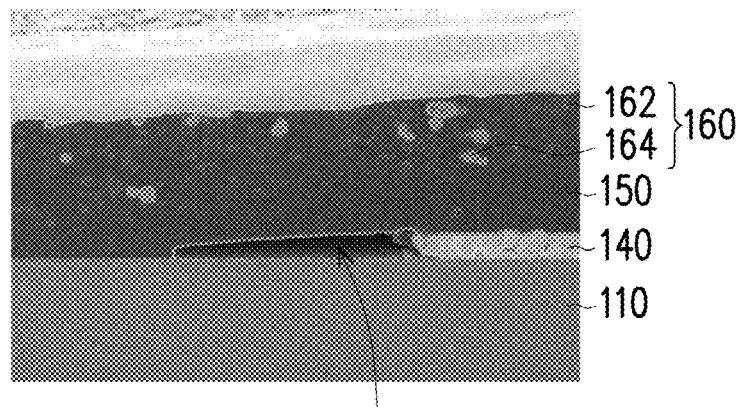
FIG. 9 shows cross-sections of a substrate, a side wiring, a protective film and a first filler captured with an electron microscope.

FIG. 9 shows the cross-sections of the substrate 110, the side wiring 140, the protective film 150 and the first filler 160 captured with an electron microscope. The viscosity of the first material 162 of the first filler 160 in FIG. 9=53000 cP (i.e. the viscosity of the first material 162 of the first filler 160 is greater than 50000 cP). It may be seen from FIG. 9 that when the viscosity of the first material 162 of the first filler 160 is greater than 50000 cP, the first filler 160 does not fully penetrate and fill the gap g.

Figure 10:
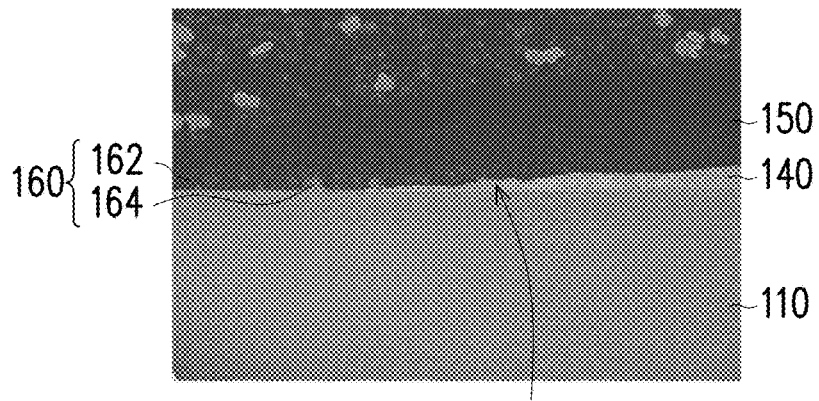
FIG. 10 shows cross-sections of a substrate, a side wiring, a protective film and a first filler captured with an electron microscope.

FIG. 10 shows the cross-sections of the substrate 110, the side wiring 140, the protective film 150 and the first filler 160 captured with an electron microscope. The viscosity of the first material 162 of the first filler 160 of FIG. 10=50000 cP. It may be seen from FIG. 10 that when the viscosity of the first material 162 of the first filler 160 is equal to 50000 cP, the first filler 160 may fully penetrate and fill the gap g.

Figure 11:
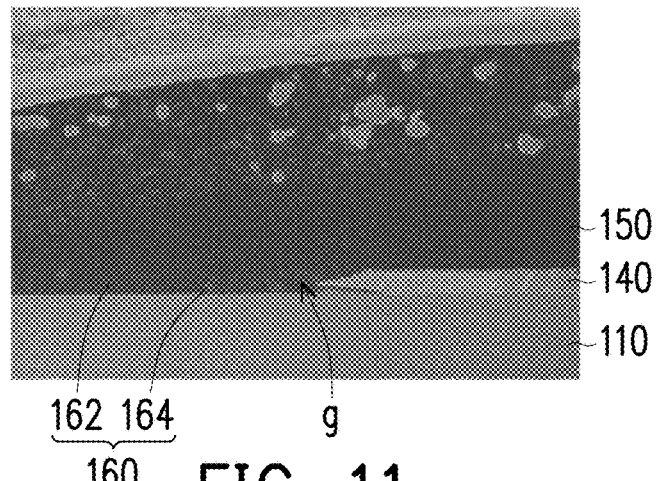
FIG. 11 shows cross-sections of a substrate, a side wiring, a protective film and a first filler captured with an electron microscope.

FIG. 11 shows the cross-sections of the substrate 110, the side wiring 140, the protective film 150 and the first filler 160 captured with an electron microscope. The viscosity of the first material 162 of the first filler 160 in FIG. 11=12000 cP (i.e. the viscosity of the first material 162 of the first filler 160 is less than 50000 cP). It may be seen from FIG. 11 that when the viscosity of the first material 162 of the first filler 160 is less than 50000 cP, the first filler 160 may fully penetrate and fill the gap g.

Figure 1E:
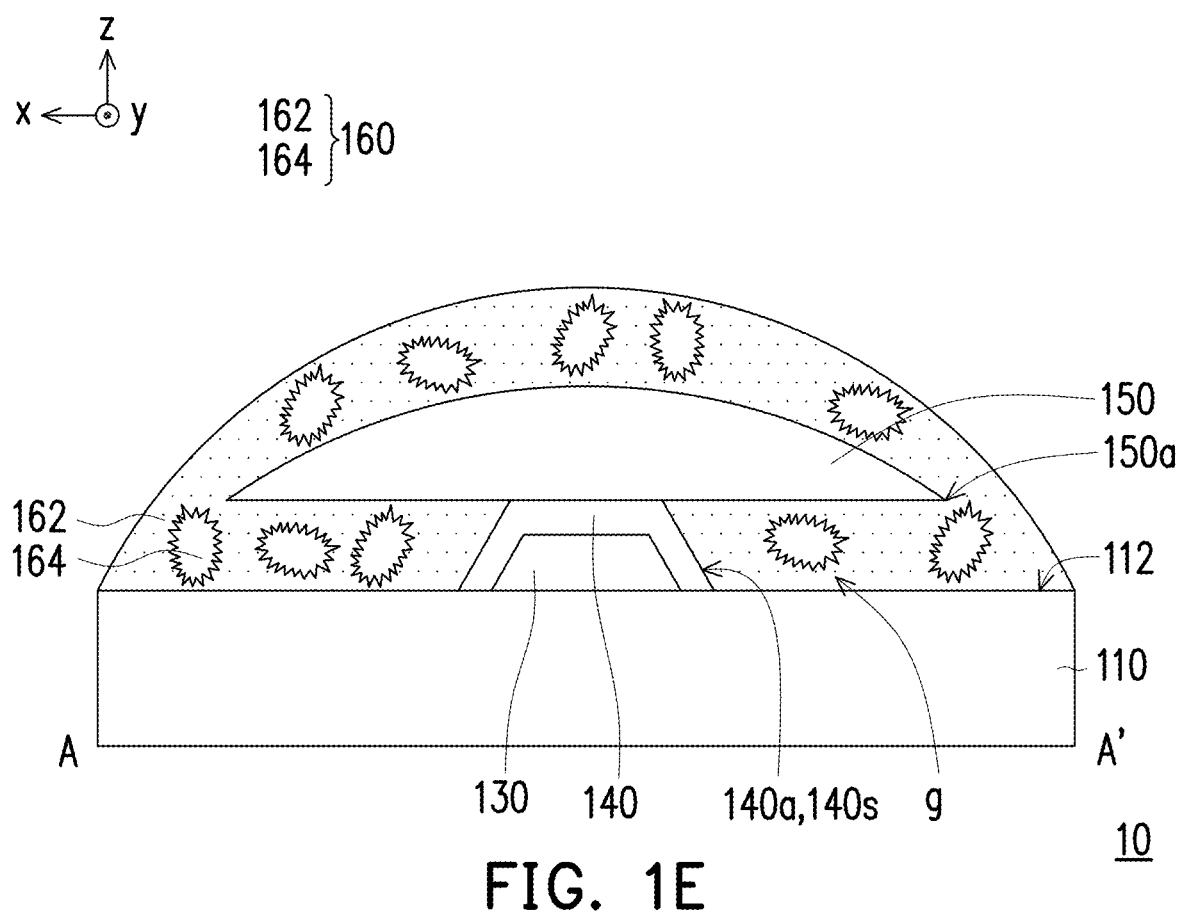

Referring to FIG. 1E, the particles 164 may not only help the first filler 160 to fill the gap g, but also improve the capability of blocking moisture of the first filler 160, thereby increasing the reliability of the electronic device 10. Specifically, the first filler of the comparative example includes the first material 162 of the first filler 160 of the embodiment but does not include the particle 164. By measuring a water vapor transmission rate of the first filler of the comparative example having the same thickness (for example, 30 μm) and the first filler 160 of the embodiment, the water vapor transmission rate of the first filler 160 is found to be 57 g/m²·day and the water vapor transmission rate of the first filler 160 of the embodiment is found to be 27 g/m²·day. That is to say, the water vapor transmission rate of the first filler 160 of the embodiment is lower than the water vapor transmission rate of the first filler 160 of the comparative example. The capability of blocking moisture of the first filler 160 of the present embodiment is better than the capability of blocking moisture of the first filler of the comparative example.

Figure 12:
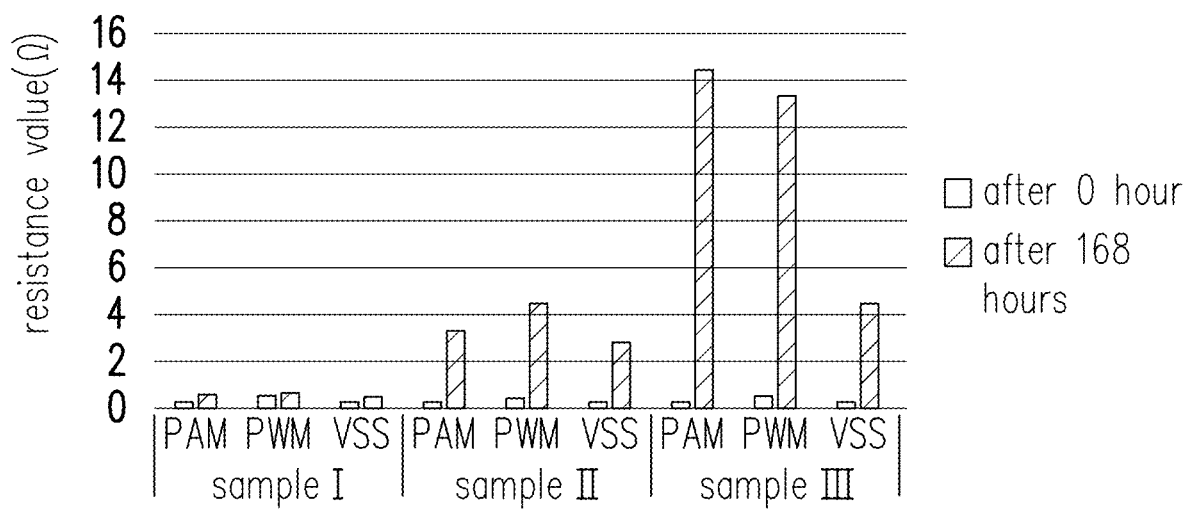
FIG. 12 shows a high-temperature and high-humidity test result of an electronic device of a comparative example.
Figure 13:
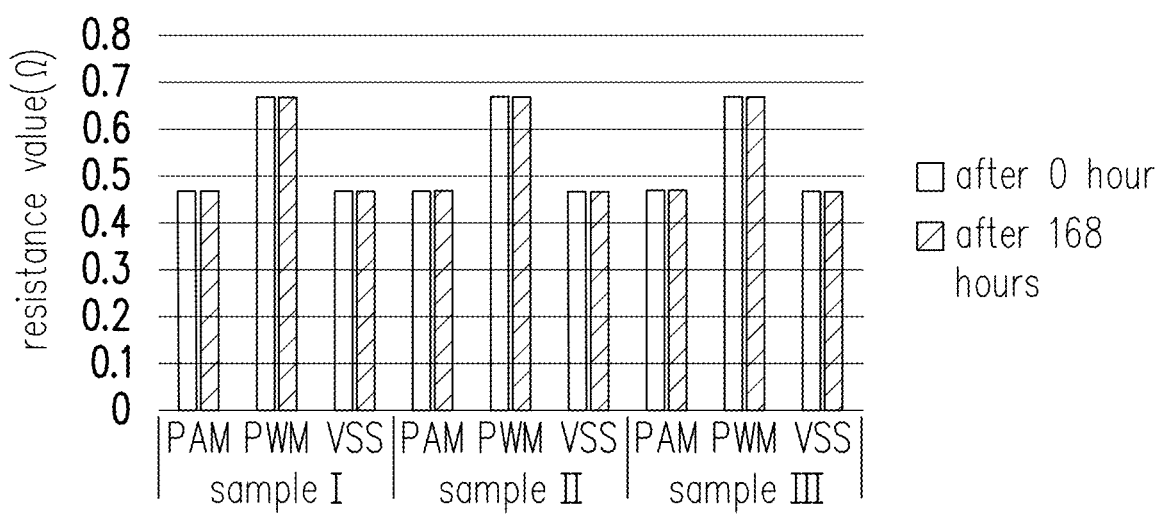
FIG. 13 shows a high-temperature and high-humidity test result of an electronic device according to an embodiment of the disclosure.

FIG. 12 shows a high-temperature and high-humidity test result of an electronic device of a comparative example. FIG. 13 shows a high-temperature and high-humidity test result of an electronic device according to an embodiment of the disclosure. The only difference between the electronic device of the comparative example and the electronic device 10 of the embodiment is that the first filler of the comparative example does not include the particles 164.

Referring to FIG. 12, after sample I, sample II, and sample III of the electronic device of the comparative example are tested at a high temperature of 85° C. and a high humidity of 85% after 168 hours, a resistance value measured at three electrodes PAM, PWM, and VSS becomes significantly larger and high. Referring to FIG. 13, after the sample I, the sample II, and sample III of the electronic device 10 of the embodiment are tested at the high temperature of 85° C. and the high humidity of 85% after 168 hours, the resistance value measured at the three electrodes PAM, PWM, and VSS is substantially constant and low, which proves that by adding the particle 164, the electronic device 10 of the embodiment has better resistance to high temperature and high humidity, and has better reliability.

It should be noted here that the following embodiments use the same reference numerals and parts as the previous embodiments, where the same reference numerals indicate the same or similar components, and the description of the same technical content is omitted. The description of the omitted parts can be found in the preceding embodiments, and will not be repeated in the following embodiments.

Figure 14:
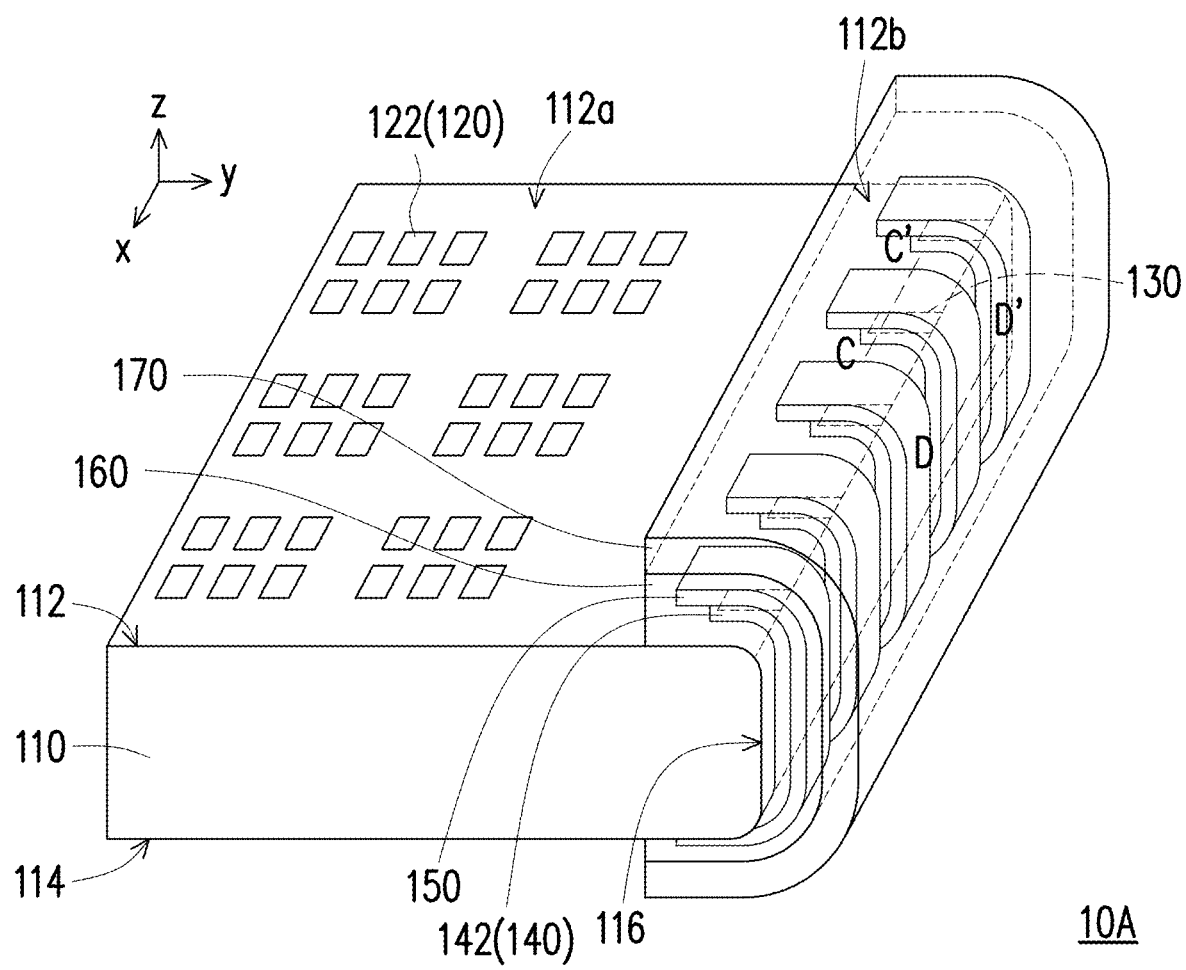
FIG. 14 is a perspective schematic view of an electronic device according to an embodiment of the disclosure.
Figure 15:
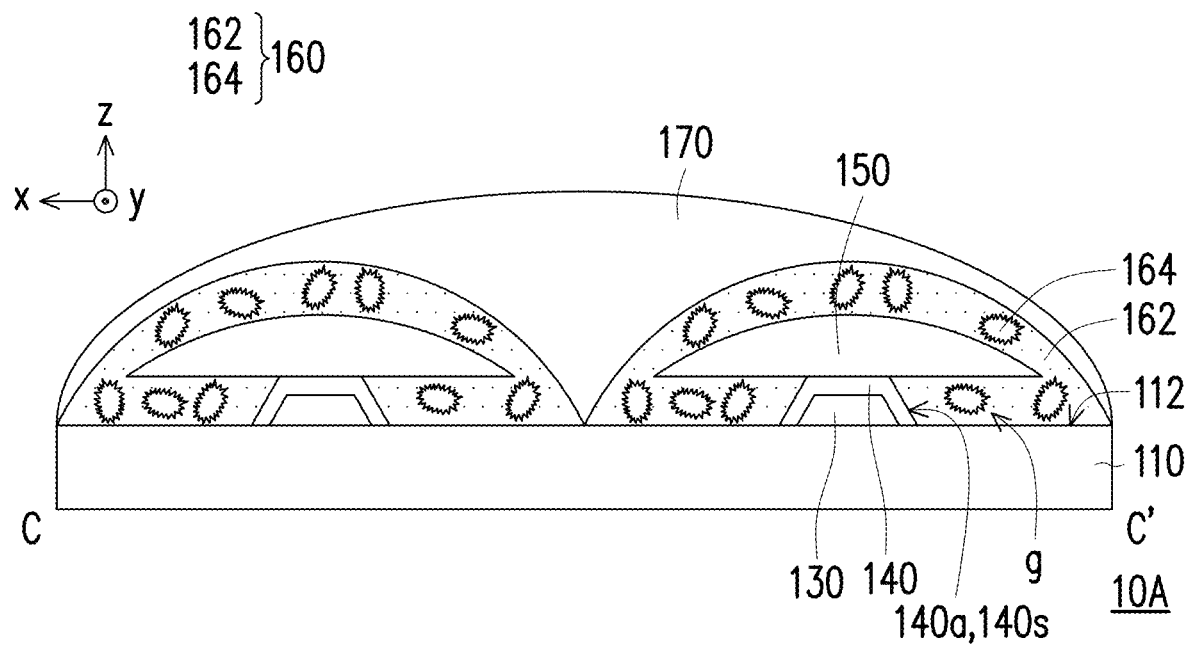
FIG. 15 is a schematic cross-sectional view of an electronic device according to another embodiment of the disclosure.
Figure 16:
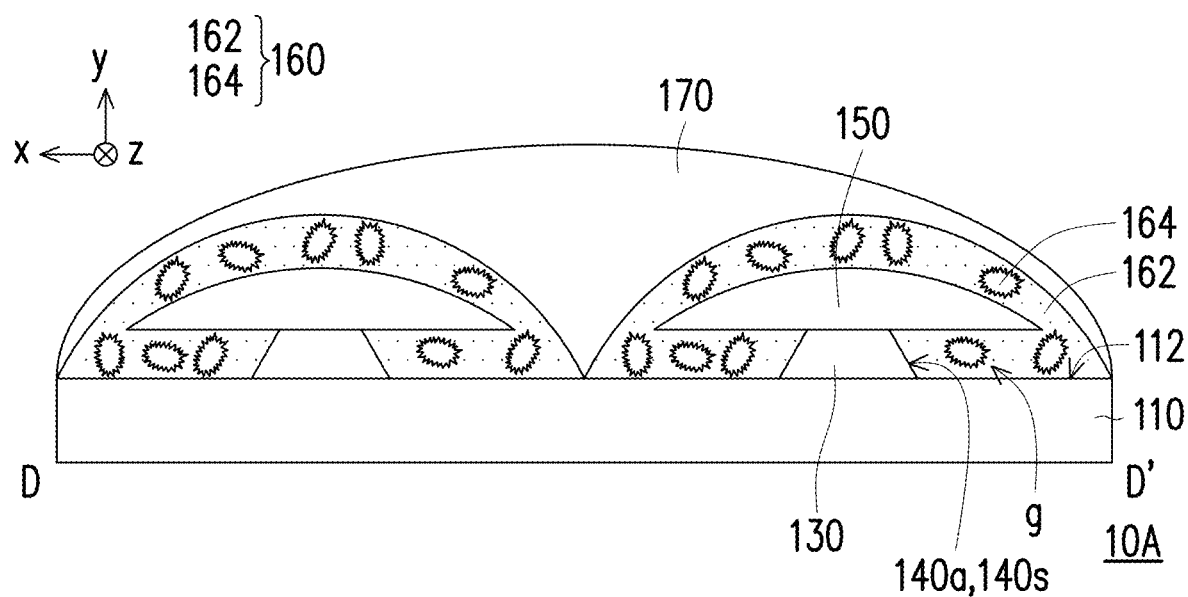
FIG. 16 is a schematic cross-sectional view of an electronic device according to another embodiment of the disclosure.

FIG. 14 is a perspective schematic view of an electronic device according to an embodiment of the disclosure. FIG. 15 is a schematic cross-sectional view of an electronic device according to another embodiment of the disclosure. FIG. 15 corresponds to line C-C' of FIG. 14. FIG. 16 is a schematic cross-sectional view of an electronic device according to another embodiment of the disclosure. FIG. 16 corresponds to line D-D' of FIG. 14.

An electronic device 10A of FIG. 14, FIG. 15, and FIG. 16 is similar to the electronic device 10 of FIG. 1E, FIG. 2, and FIG. 3. The difference between the two is that the electronic device 10A of FIG. 14, FIG. 15, and FIG. 16 further includes a second filler 170.

Referring to FIG. 14, FIG. 15, and FIG. 16, the second filler 170 is disposed on the first filler 160. Part of the first filler 160 is disposed between the second filler 170 and the protective film 150. The second filler 170 does not have the particle 164. The water vapor transmission rate of the second filler 170 is lower than the water vapor transmission rate of the first filler 160. The viscosity of the first material 162 of the first filler 160 is lower than the viscosity of the second filler 170. That is to say, a fluidity of the first filler 160 is better than the fluidity of the second filler 170, and the capability of blocking moisture of the second filler 170 is better than the capability of blocking moisture of the first filler 160. The first filler 160 may fully penetrate and fill the gap g between the protective film 150 and the substrate 110 during the manufacturing process of the electronic device 10A. The second filler 170 may complement the deficiency of the first filler 160 having low viscosity but weak capability of blocking moisture, which further improves the reliability of the electronic device 10A.

Figure 17:
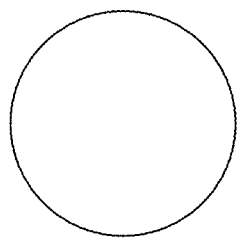
FIG. 17 is a schematic view of a particle of a first filler of an electronic device according to another embodiment of the disclosure.

FIG. 17 is a schematic view of a particle of a first filler of an electronic device according to another embodiment of the disclosure. In the embodiment of FIG. 17, a particle 164B may be spherical. The spherical particle 164B may be used to replace the irregular particle 164 in the electronic devices 10 and 10A, and the electronic device formed in this way is also within the protection scope of the disclosure.

Figure 18:
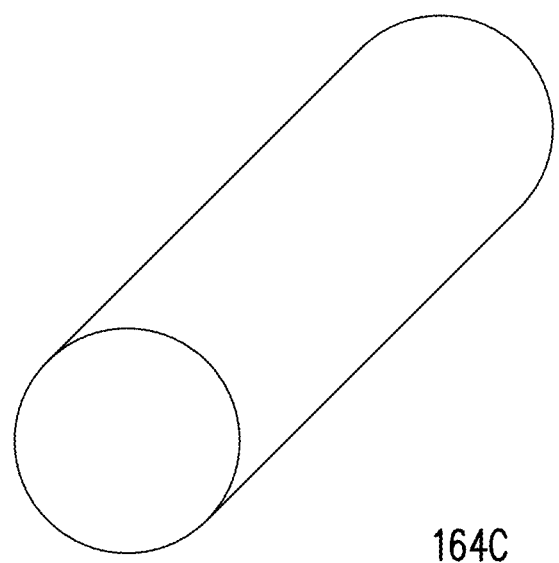
FIG. 18 is a schematic view of a particle of a first filler of an electronic device according to another embodiment of the disclosure.

FIG. 18 is a schematic view of a particle of a first filler of an electronic device according to another embodiment of the disclosure. In the embodiment of FIG. 18, a particle 164C may be rod-shaped. The rod-shaped particle 164C may be used to replace the irregular particle 164 in the electronic devices 10 and 10A, and the electronic device formed in this way is also within the protection scope of the disclosure.

Figure 19:
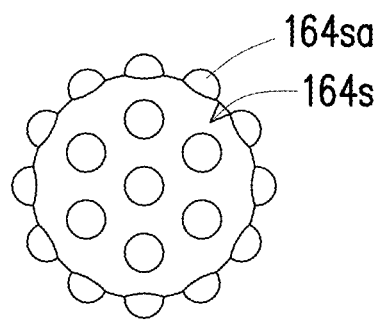
FIG. 19 is a schematic view of a particle of a first filler of an electronic device according to an embodiment of the disclosure.

FIG. 19 is a schematic view of a particle of a first filler of an electronic device according to an embodiment of the disclosure. In the embodiment of FIG. 19, a particle 164D may be a sphere, and a spherical surface 164s of the sphere has multiple protrusions 164sa. The particle 164D may be used to replace the irregular particle 164 in the electronic devices 10 and 10A, and the electronic device formed in this way is also within the protection scope of the disclosure.

What is claimed is:

1. An electronic device, comprising:
   a substrate, having a first surface, a second surface, and a side surface connected between the first surface and the second surface;
   a side wiring, disposed on the substrate and extending from the first surface to the second surface through the side surface;
   a protective film, disposed on the side wiring, wherein the side wiring is sandwiched between the substrate and the protective film, an edge of the protective film extends beyond a side wall of the side wiring, and the protective film, the side wall of the side wiring, and the substrate define a gap; and
   a first filler, disposed on the protective film and in the gap, wherein the first filler comprises a first material and a plurality of particles mixed within the first material.

2. The electronic device according to claim 1, wherein the gap has a width in a direction perpendicular to the side surface of the substrate, the width is a, one of the particles is disposed in the gap, the one of the particles has a height in the direction, the height is b, and a≥b>0.5a.

3. The electronic device according to claim 1, wherein a viscosity of the first material of the first filler is less than or equal to 50000 cP.

4. The electronic device according to claim 1, further comprising:
   a second filler, disposed on the first filler, wherein a water vapor transmission rate of the second filler is lower than a water vapor transmission rate of the first filler.

5. The electronic device according to claim 1, further comprising:
   a second filler, disposed on the first filler, wherein a viscosity of the first filler is lower than a viscosity of the second filler.

6. The electronic device according to claim 1, wherein one of the particles is spherical, rod-shaped or irregular.

7. The electronic device according to claim 1, wherein one of the particles is a sphere, and a spherical surface of the sphere has a plurality of protrusions.

* * * * *